United States Patent [19]

Chan et al.

[11] Patent Number: 5,226,051
[45] Date of Patent: Jul. 6, 1993

[54] LASER PUMP CONTROL FOR OUTPUT POWER STABILIZATION

[75] Inventors: Melvin Chan, Daly City; Henry G. Plaessman, Mountain View; Frank Adams, San Leandro; William M. Grossman, Los Altos, all of Calif.

[73] Assignee: Lightwave Electronics, Mountain View, Calif.

[21] Appl. No.: 710,288

[22] Filed: Jun. 4, 1991

[51] Int. Cl.$^5$ .................................... H01S 3/13
[52] U.S. Cl. .............................. 372/30; 372/10; 372/29; 372/25; 372/26; 372/69; 372/70
[58] Field of Search ............... 372/29, 10, 69, 70, 372/25, 26, 30

[56] References Cited

U.S. PATENT DOCUMENTS

| | | | |
|---|---|---|---|
| 3,258,596 | 6/1966 | Green | 372/30 |
| 3,478,280 | 10/1966 | Fenner | 372/26 |
| 3,613,024 | 10/1971 | Geusic et al. | 372/13 |
| 3,633,124 | 1/1972 | Danielmayer | 372/30 |
| 3,641,459 | 2/1972 | Paoli et al. | 372/30 |
| 3,747,019 | 7/1973 | Keochner et al. | 372/10 |
| 3,928,815 | 12/1975 | Hellwarth | 372/10 |
| 4,337,442 | 6/1982 | Mauck | 372/13 |

OTHER PUBLICATIONS

Wagner and Lengyel, Journ. Appl. Phys., vol. 34 (Jul. 1963) pp. 2040–2046.
Chesler, Karr and Geusic, Proc. I.E.E.E., vol. 58 (Dec. 1970) pp. 1899–1914.

Primary Examiner—Georgia Y. Epps
Attorney, Agent, or Firm—John Schipper

[57] ABSTRACT

Method and apparatus for stabilization of pulse energies produced by a continuously pumped, Q-switched, solid-state or gas laser, through control of the optical power delivered by an optical pump to the laser, in order to limit the energy emitted in any single laser pulse as a result of Q-switching. The laser pump is driven at full strength for a selected initial refresh time $t_r$. If a Q-switch trigger signal is received by the laser before the elapsed time $\Delta t$ has reached the refresh time $t_r$, the laser emits a pulse with the reduced energy stored in the laser at that time. If the elapsed time reaches or exceeds the refresh time $t_r$, the optical pump power subsequently delivered to the laser is reduced to a lower level, which may be time-dependent, that is sufficient to maintain the net energy stored in the laser at a predetermined value so that the energy in a subsequently emitted laser pulse does not exceed a selected limit. Numerous techniques for controlling the optical pump power delivered are disclosed.

18 Claims, 5 Drawing Sheets

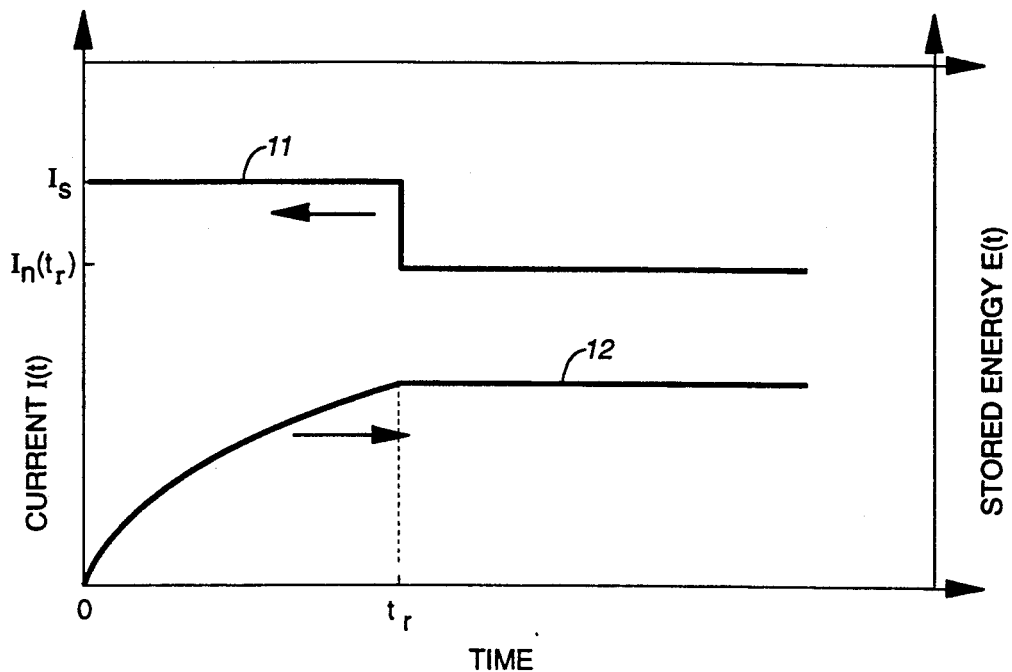
FIG._1
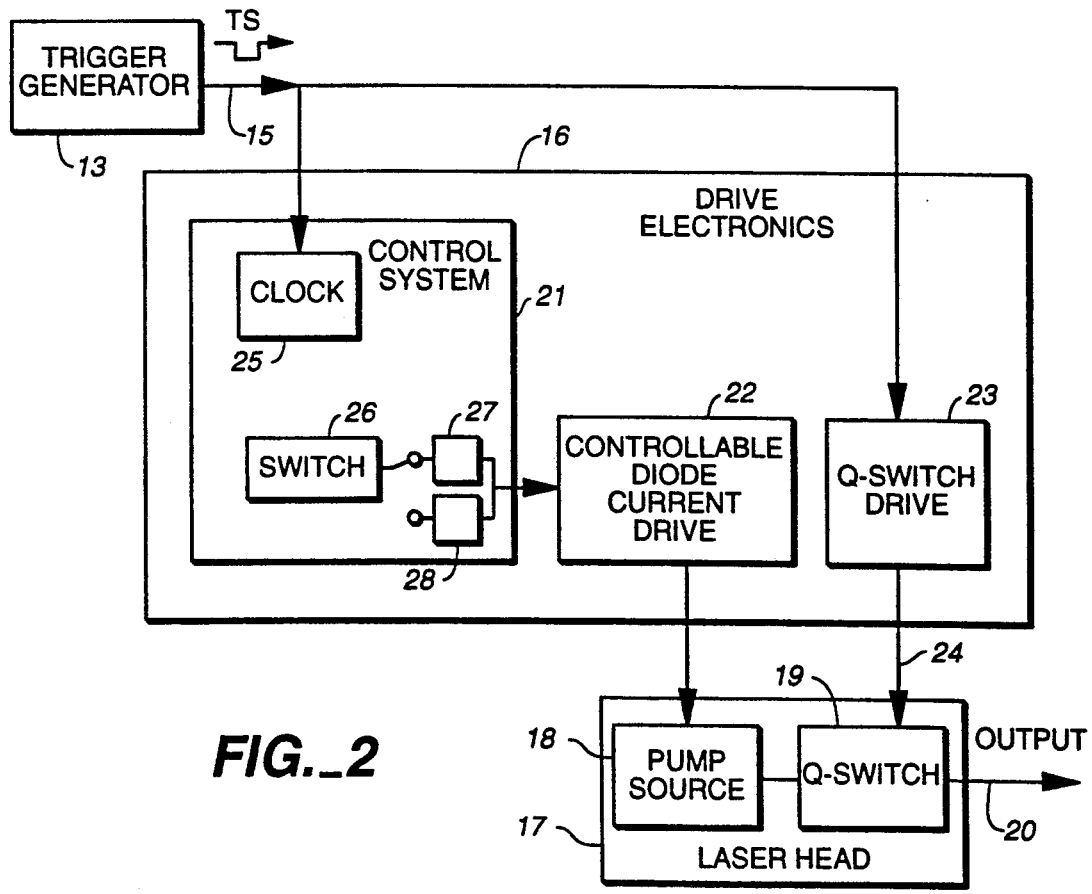
FIG._2

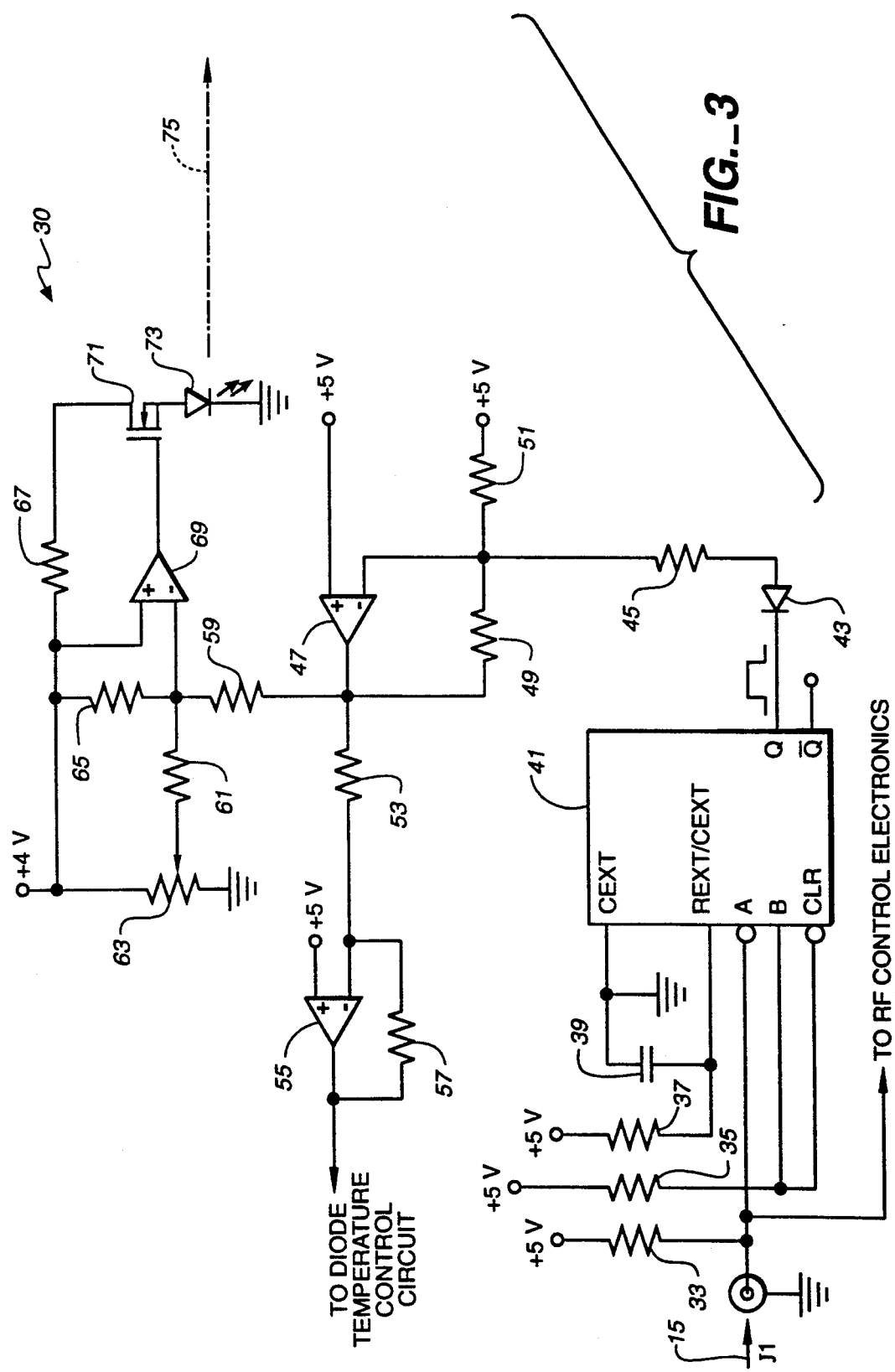

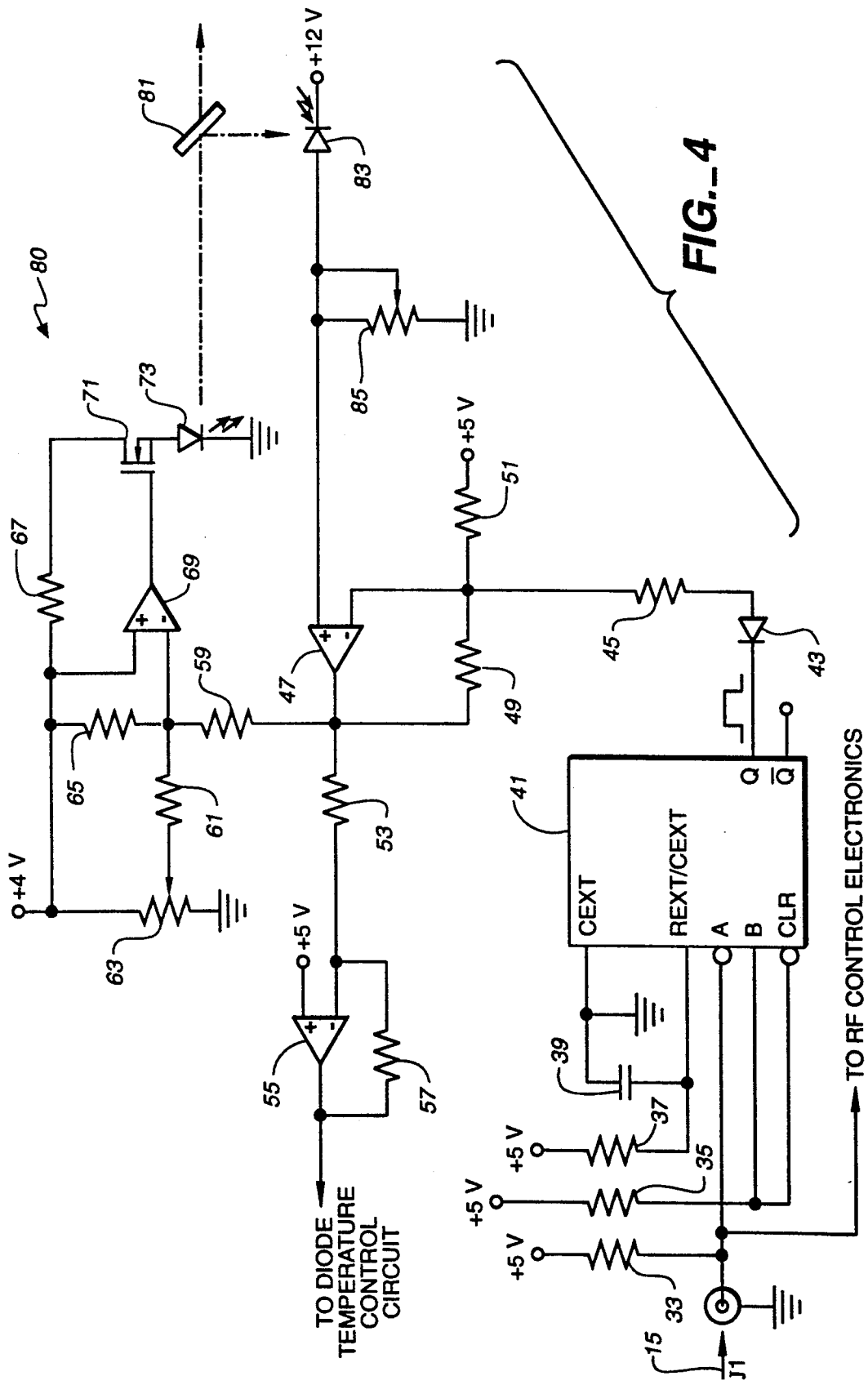
FIG._4

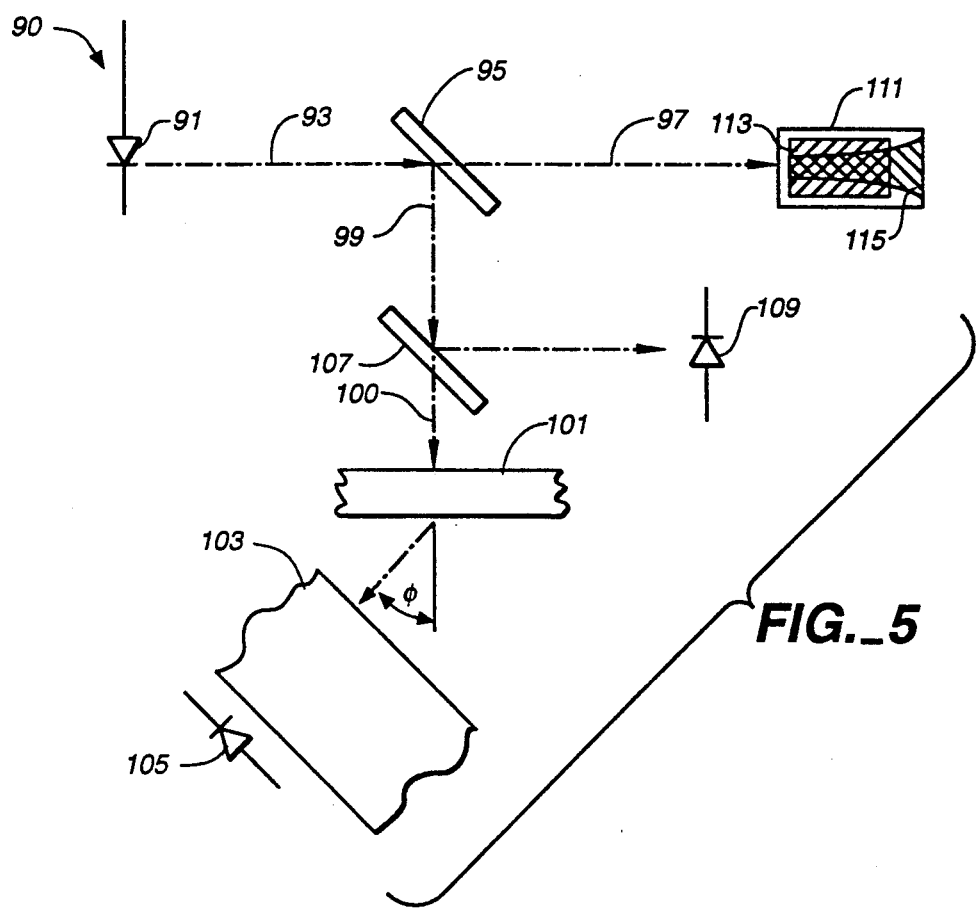
FIG._5
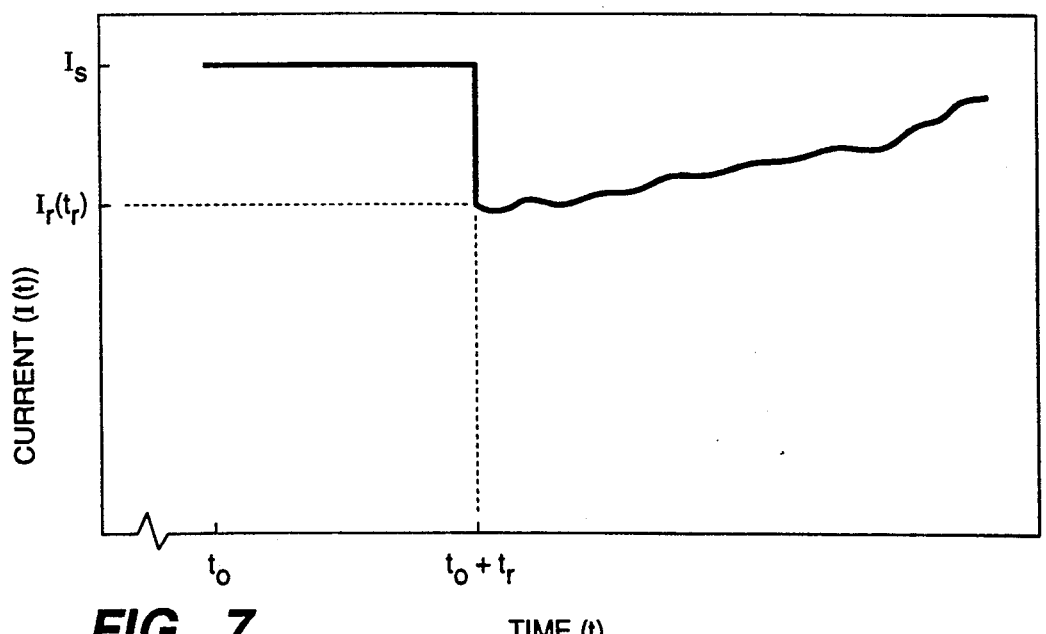
FIG._7

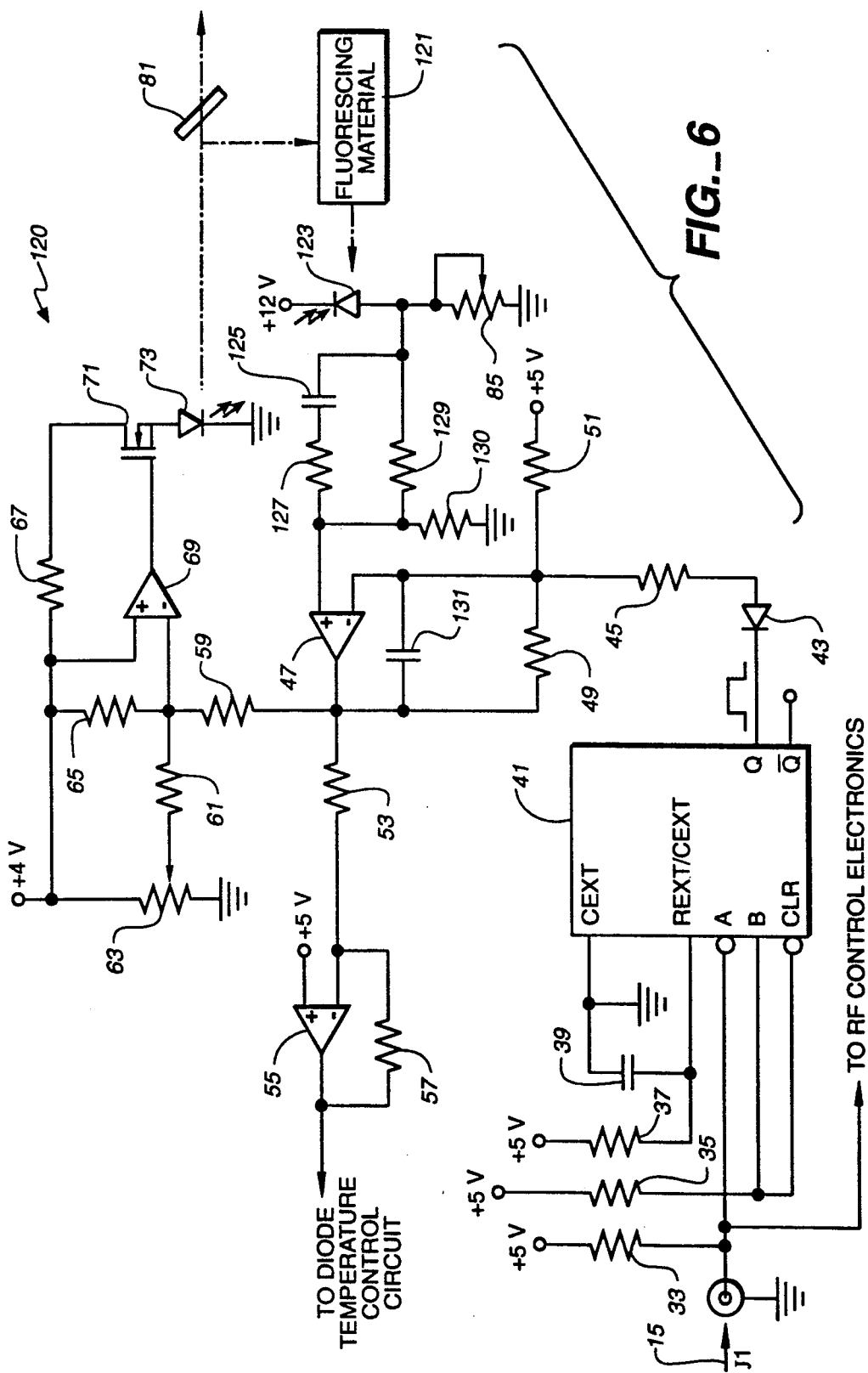
FIG._6

LASER PUMP CONTROL FOR OUTPUT POWER STABILIZATION

FIELD OF THE INVENTION

The invention relates generally to a laser energy control system for pulsed lasers. It allows pulsed lasers optimized for high repetition rates to operate reliably at low repetition rates. It also allows lasers to operate over a greater range of repetition rates with minimum variation in pulse energy. Particularly, it is a method of limiting the laser's optical output energy at low repetition rates by simple control of the pump source power.

BACKGROUND OF THE INVENTION

A technique referred to as "Q-switching" generates short laser pulses by placing an optical switch in the laser cavity. Q-switching is described by U.S. Pat. Nos. 3,613,024 and 3,928,815, issued to Geusic and to Hellwarth, respectively, and incorporated herein by reference. In Q-switched lasers, an energy source supplies electrical or optical excitation to or "pumps" the laser medium. A user triggers the optical switch from a high loss condition to a low loss or "high Q" condition, allowing a laser pulse to build up and issue from the optical cavity. During the period of pumping, energy is simultaneously absorbed from pumping and dissipated through spontaneous emission and non-radiative transfer. Energy dissipation from the upper laser level occurs at a rate approximately proportional to the upper laser level population, and inversely proportional to a material-dependent parameter, the effective decay lifetime. This decay lifetime is affected by many physical parameters of the material; to name a few, the material composition, the pressure, the temperature, and the density of other atoms, ions, or molecules in different quantum states that can interact with the upper level population. The energy in each laser pulse depends on the pumping rate, the time between pulses, and the population density distribution of the laser medium after the last pulse, if one occurred.

A laser's pumping can be either continuous (cw) or pulsed. Here, "cw pumping" refers to pumping by a source that may be, but need not be, operated at constant power over time. The cw pump may be modulated to different levels, as distinguished from pulsed pumping which exclusively operates in brief, discrete time intervals. A cw-pumped Q-switched laser can generally operate either with pulsed output, or with cw output, if the Q-switch is suitably driven. A feature of cw pumping is that the user can Q-switch the laser at nearly any time and the laser emits a pulse, provided there is sufficient time to absorb pump energy; there is no need to wait for a burst of pump energy. However, with continuous pumping, the performance parameters of a particular pulse vary depending upon the time duration of laser pumping between pulses.

As described by Wagner and Lengyel, Jour. Appl. Phys., vol. 34 (1963) 2040–2046, the stored energy and gain in the laser, along with the length of the laser optical cavity, determine the minimum attainable pulse width. Increasing the gain allows reduced pulse widths, and the gain is proportional to the stored energy. According to Chesler, Karr and Geusic, Proc. I.E.E.E., vol. 58 (1970) pp. 1899–1914, with continuous pumping the stored energy, $E_s$, varies approximately according to $$E_S = E_0[1 - \exp(-t_S/T)], \quad (1)$$

where $t_s$ is the duration of energy storage, $T$ is the fluorescence decay lifetime of the laser material, and $E_0$ is the maximum energy stored. Repetition rates much greater than $1/T$ are considered "high" in this context, and repetition rates much less than $1/T$ are "low". At low pulse repetition rates, the stored energy, $E_s$, approaches the laser's maximum storable energy, $E_0$, and the pulse width approaches its corresponding minimum. Consequently, the peak pulse power asymptotically approaches a maximum as the pulse repetition rate is reduced. If a burst of many pulses at high repetition rate is emitted, the laser generates the first pulse of the burst after an extended energy storage time, and the first pulse is therefore more energetic than the subsequent pulses. The energy delivered by this first pulse can be large enough to be catastrophic in many applications, from medical to microelectronic micromachining.

Three desirable characteristics of a pulsed laser are that: (1) it is stable over time; (2) it has a similar pulse energy regardless of the time duration between pulses; and (3) it is not subject to optical damage. In laser design, these characteristics are balanced against other desires, such as high energy pulses in some applications. Furthermore, for some applications, such as high repetition rate materials processing or high data rate optical probing, the laser must work reliably at multi-kilohertz repetition rates. The laser need not have increased pulse energy or reduced pulse width at lower repetition rates. In fact, it is often desirable that performance remain unchanged from an application-determined, multi-kilohertz rate down to lower rates. It is generally unacceptable if the laser cannot perform reliably at low repetition rates or, worse yet, if the more energetic laser pulses at low repetition rates damage one or more laser optical components.

A particular area where it is advantageous to maintain an upper limit on the pulse energy at low repetition rates is with lasers optimized for short pulses at high repetition rate operation. Often it is desirable to maintain nearly constant pulse energy, pulse width, pulse power, and pulse timing delay as the repetition rate is varied from 0 Hz to many kilohertz. For those lasers operating on relatively low gain transitions, such as the 1.3 $\mu$m lines of neodymium-doped solid-state lasers Nd:YAG and Nd:YLF, restricting the power of pulses at low repetition rates could prevent optical damage. Because the 1.3 $\mu$m wavelength is near a dispersion minimum in optical fiber materials, lasers that emit at 1.3 $\mu$m are of technological importance and are important sources for fiber optic sensors and communications. Lasers of wavelength 1.3 $\mu$m have been operated successfully with pulse widths shorter than 10 nsec at 10 kHz. Users may run these lasers at lower repetition rates as well. Unfortunately, the low stimulated emission cross-section of these lines means that high intra-cavity fluences are required to efficiently extract energy. Low repetition rate operation can cause single-pulse optical damage to intra-cavity elements if the energetic pulses are allowed to develop. If the Q-switch in the laser system cannot produce enough loss to prevent laser emission at low repetition rates, although the laser may not be damaged, its performance at low repetition rates will be irregular and useless for many applications.

Many control systems can help equalize the energy of pulses from a laser. One solution is a closed loop control system that measures a parameter of each pulse, such as energy, and corrects the pumping level accordingly to stabilize that parameter at a fixed level for subsequent pulses. Such a system bases its feedback signals on the pulse history and cannot look ahead. If the repetition rate changes rapidly, there are transitional periods of poor output control that can produce catastrophic optical damage. An example of such a transition in repetition rates is the initial power-up of a laser: The laser goes from 0 Hz to an operational frequency of possibly tens of kilohertz, and the first pulse issued will be very large. Similarly, if the user triggers pulses at random intervals, difficulties will arise.

The first energetic pulse can be suppressed if the pump source is extinguished at the start of a pulse burst. This technique is described in U.S. Pat. No. 4,337,442, issued to Mauck for a laser pulse modulation system, where energy variation in pulses is reduced. However, this is done by elimination of pulses, and the remaining issued pulses are unavoidably delayed from the trigger signal that initiates the pulse burst. Another limitation of the technique in certain applications is that, if the user desires a single pulse, the system may simply eliminate it, believing it to be the first pulse of a burst.

Another potentially useful pulse control method requires a time delay between the arrival of a trigger signal and the emission of a pulse. Then the laser control system knows the time that will be allotted for pumping, and can anticipate the required pump level to produce a desired pulse energy. This approach introduces long delays between trigger and each issued pulse, which is unacceptable in some applications. Yet another approach is to monitor spontaneous emission fluorescence from the laser medium as a measure of stored energy. A feedback system controls the pump power in order to equalize fluorescence level for all pulses. Laser fluorescence can be a useful measure of stored energy in some applications, but it is not a perfect predictor of the laser gain and pulse widths because the fluorescence is not restricted to the excited population strictly within the mode volume of the laser. Another approach intentionally uses a Q-switch with inadequate Q spoiling, preventing sufficient energy build-up so that powerful damaging pulses do not occur. However, at low repetition rates, a laser with an inadequate Q-switch will emit light in a periodically interrupted cw output, and the pulse energy stability will be generally poor.

Feedback mechanisms and the like have been used from time to time to control some aspect of laser Q-switching or other excitation. In U.S. Pat. No. 3,258,596, issued to Green, a pulse frequency-modulated injection laser is disclosed in which the repetition rate of a voltage-controlled current switching device is controlled to allow sufficient time for a laser diode switch to recover to generate a new switching signal.

Fenner, in U.S. Pat. No. 3,478,280, discloses pulse-width-modulated laser switching of a semiconductor laser by adjustment of the turn-on delay of the laser. From one perspective, control of the current amplitude applied to the laser allows control of the time required to fill or saturate the photon traps present in the laser material. This, in turn, controllably delays the time at which photon build-up occurs before a laser pulse is emitted. This effect is more significant at room temperature than at lower temperatures. This approach is not directly applicable to Q-switched lasers.

A laser feedback circuit for controlling relaxation oscillation pulses in a solid-state laser is disclosed in U.S. Pat. No. 3,633,124, issued to Danielmeyer. The phase difference between a stable periodic perturbation of a laser pump source and the laser output pulse is externally detected, and a feedback signal is used to restore this phase difference to a desired level. Here, the goal is to produce peak output pulse intensities that are as much as 20 times the average laser power, not to limit the output intensity to a given range for all pulses including start-up.

Paoli et al disclose apparatus for narrowing the pulse width and stabilizing the repetition rate in semiconductor lasers with self-induced pulsing, in U.S. Pat. No. 3,641,459. A small portion of the laser output signal is split off, and the present pulse repetition rate is determined. A portion of the laser output signal is reflected by an external mirror and returned to the active region of the laser to perturb the laser output signals. Pulse narrowing and rep rate stability are achieved when the speed of light, divided by the product of pulse rep rate (frequency) times optical path length from laser end face to mirror, is a ratio of two integers. Repetition rate for laser self-pulsing apparently approaches and stabilizes at a value that produces one of these ratios. This approach does not attempt to limit the amplitudes of the output pulses to a given range.

Method and apparatus for stabilizing the amplitude, pulse width and repetition rate of a Q-switched laser output signal is disclosed by Koechner et al in U.S. Pat. No. 3,747,019. The laser output beam is linearly polarized, and all light above a predetermined amplitude level is removed to provide a sequence of intermediate pulses of approximately uniform amplitude. A central part of each pulse of a sequence of pulses is then passed, using one or more Pockels cells as a shutter, to control the pulse amplitude and pulse width of a sequence of output pulses finally issued by the apparatus. No control of initial excitation of the laser medium or the intracavity pulse is exercised here. Consequently, large, potentially damaging pulses may be generated within the laser cavity.

What is needed is a control system for cw-pumped, Q-switched lasers to restrain the pulse energy at low repetition rates, while permitting full energy performance at high repetition rates, without requiring advance information on the arrival times of future trigger signals. Preferably, a laser driven by this control system should be stable over time as the pump components age and/or the pump parameters drift with time, and laser excitation input energy should be controlled in order to improve laser operating efficiency.

SUMMARY OF THE INVENTION

It is an object of the invention to produce controls for a Q-switched laser that provide optimized short-pulse high-repetition rate operation, and operation at intermediate and low repetition rates with minimal risk of optical damage to intra-cavity components.

Another object of this invention is to allow the laser to minimize performance variations over time and over a wide range of pulse repetition rates, from 0 Hz to as high as the application demands. Pulsed performance parameters of interest are pulse energy, pulse width, peak power, pulse timing delay with respect to the trigger, and pulse-to-pulse variations in these parameters.

A further object of this invention is to provide these controls on a pulsed laser, where the user triggers the laser at the user's discretion, so that the laser system requires no warning of the upcoming inter-pulse timing.

A further object of this invention is to provide controls on pulse energy that are easily implemented, and do not degrade the life of the pump source.

The above-stated needs are met by the invention, which is a control system for the pump source. The control system drives the laser pump at full operating power for a predetermined time interval, $0<t<t_r$, following each pulse. In this time, the energy stored in the laser medium is refreshed and increased. If a trigger signal arrives during this refresh time interval, the laser emits a pulse with less than full energy. If a trigger does not arrive during the refresh interval, the control system then throttles back the pump power to a lower fixed level that can be set to sustain the energy stored in the laser medium and not allow the stored energy to increase further. Consequently, there is a delayed current or voltage reduction following each pulse. The control system has two parameters that must be set, namely, the length $t_r$ of the full drive time interval during which the pump is driven at full power, and the percentage reduction in current drive or output power at the termination of this full drive interval. These can be set to prevent optical damage in the laser, and to allow the laser to operate with nearly constant performance over a user-specified range of repetition rates, from 0 Hz to a user-chosen rate, as discussed below. Feedback to the pump source optionally stabilizes the pump source output power for stable extended pump operation.

BRIEF DESCRIPTION OF THE DRAWINGS

FIG. 1 is a graphical view of current as a function of time after a pulse emission, and stored laser optical energy as a function of time after a pulse emission.

FIG. 2 is a functional block diagram of the laser power control system used in conjunction with a user-supplied laser trigger and a Q-switched laser head according to one embodiment of the invention.

FIG. 3 is a schematic view of a preferred embodiment of the electronic circuit for the laser power control system, in which the laser diode operates under current control.

FIG. 4 is a schematic diagram of a preferred embodiment of the electronic circuit for the laser power control system, in which the laser diode operates under optical power control.

FIG. 5 illustrates beam sampling of a laser diode pump source, where the sampled light is directed into a separate volume of laser material, the fluorescence of the material is monitored by a detector for use in pump power control, and the unabsorbed pump light is filtered from the detector.

FIG. 6 is a schematic view of an embodiment of an electronic circuit useful in monitoring fluorescence emissions of a surrogate laser medium in order to control Q-switch activity for the actual laser.

FIG. 7 graphically illustrates how the reduced current value $I_r$ used in the invention may vary with time to compensate for "bottlenecking" or other effects in a multiple-level laser.

DESCRIPTION OF PREFERRED EMBODIMENTS

FIG. 1 illustrates the development of current, 11 and of the resulting energy 12 stored in the excited laser medium according to the invention. The time rate of change of stored energy abruptly changes at a predetermined refresh time $t=t_r$. With more current or less current applied after the time $t=t_r$, the net stored energy asymptotically reaches a slightly higher constant level or lower constant level, respectively. The laser control system drives a laser head that consists of a pumping means and a Q-switched laser cavity. The pumping means may be, but need not be, physically separated from the laser optical cavity. The laser operates under laser diode current control in this embodiment.

In a typical user operation, a trigger signal initiates a laser drive circuit to produce a laser pulse from a laser head. In the preferred embodiment, the pump source is a laser diode and the laser medium is a solid-state laser material such as (but not limited to) neodymium-doped yttrium aluminum garnet (Nd:YAG), neodymium-doped yttrium lithium fluoride (Nd:YLF), or neodymium-doped yttrium vanadate (Nd:YVO$_4$). Immediately following each trigger signal, the drive current to a laser pump source operates at a standard level, $I_S$, chosen to maximize high repetition rate pulse energy, and to minimize high repetition rate pulse width. The control system drops the current to a reduced level, $I_r$, after a refresh time $t_r$.

In an alternate embodiment, the laser diode operates under power control instead of current control. Immediately following each trigger signal, the control system sets the laser diode power at a standard level $P_S$, chosen to maximize high repetition rate pulse energy and to minimize high repetition rate pulse width. The control system drops the laser diode optical output power to a reduced level $P_r$, after a refresh time $t=t_r$. For power control feedback, an optical monitor for the laser diode is probably required.

An embodiment of the control system is shown in FIG. 2. A user-supplied trigger generator 13 sends a trigger output signal TS on an electrical connection 15 to the electronic drive unit 16. The drive unit 16 electrically supplies the laser head 17, which includes a pump source 18 and a Q-switched laser cavity 19. Output pulses 20 are emitted by the laser head. The electronic drive unit consists of a control system 21 that is the subject of this invention, a controllable laser diode current drive 22 which powers the laser pump, and a Q-switch drive 23. This invention can be used with acousto-optic, electro-optic, or other active Q-switches. The user-supplied trigger signal is directed into both the Q-switch drive 23 and the pump power control system 21. The Q-switch drive translates the user-supplied trigger into a format and power necessary to drive the switch, and triggers the switch through a connection 24 with a time delay that is small compared to the typical inter-pulse time interval $t_p$ and to the fluorescence decay lifetime T of the laser medium. The pump power control system includes a clock 25 that controls the timing of an electrical switch 26, which is not the optical Q-switch. The electrical switch 26 can be in either of two conditions that set the drive current source 22 for the laser pump in either high or low state, respectively. When the present clock time interval is less than a predetermined refresh time $t_r$, the control system sets the switch for the diode's high power state. When the clock time interval length reaches or exceeds the refresh time $t_r$, the control system changes the switch to the diode's low power state. Upon the arrival of each trigger signal, the clock time interval is reset to zero.

One use of this invention is in laser systems with high repetition rate operation at rates, R, that are large with respect to the inverse of the effective fluorescence decay lifetime $1/T$. The inter-pulse time $t_p$ equals $1/R$. Consider a laser optimized for applications where there is no need for increased energy at lower repetition rates. Then the current reduction can be chosen to occur at a time $t_r$ slightly greater than $t_p$, for example, $t_r = 1.2\ t_p$, so that current reduction occurs only at repetition rates about 17 percent lower than R. Maximum possible pulse energy and average power is sustained down to the repetition rate R, and 17 percent lower. If increased energy is desired to a slightly lower repetition rate, then $t_r$ can be increased, for example, to 1.5 $t_p$. To maintain pulse energy at, or below, the repetition rate of $1/t_r$, the circuit reduces the current at time $t_r$ to a level, $I_r$, chosen during set-up to be the current that would give the same energy at low repetition rates that the laser produces with current $I_S$ at the higher repetition rate $1/t_r$. If slightly higher or lower pulse energies are desired at low repetition rates, $I_r$ can be adjusted up or down accordingly.

An implementation of the pulse control technique disclosed here is a laser-diode pumped solid-state Nd:YLF laser, designed with the aid of this invention to operate optimally at 10 kHz with the aid of this invention. In this case, we chose $t_r$ to be 150 μsec, which is 1.5 $t_p$ and which makes increasing energy available down to about 6.67 kHz as the repetition rate is reduced. The laser diode current is reduced after 150 μsec to about 65 percent of its standard operating level, $I_r/I_s = 0.65$, and the laser diode optical power falls to about 50 percent of its operating level after the time $t = t_r$. At high repetition rates (>6.67 kHz), the laser experiences no current reduction. At lower repetition rates (>6.67 kHz), the laser current is periodically reduced. The fluorescence decay lifetime T of low-doped Nd:YLF is about 0.5 msec so that a repetition rates of 10 kHz is high with respect to 1/0.5 msec = 2 kHz.

FIGS. 3 and 4 show two alternate circuits for implementation of the pulse control technique disclosed here. The first implementation reduces the pump laser diode's current to a predetermined value after a time $t = t_r$ following trigger signal arrival. In this case, the laser diode current is controlled. The second circuit implementation is similar to the first, but monitors and controls the laser diode output power instead of the laser diode current level.

In the circuit embodiment 30 shown in FIG. 3, the trigger signal TS arrives on the signal line 15 and passes a voltage pull-up that includes a resistor 33 connected to a five-volt source. The trigger signal TS is then received at a first input terminal of a one-shot module 41. Second and third input terminals of the one-shot module 41 are connected through a resistor 35 to a five-volt source. A fourth input terminal of the one-shot module 41 is connected to the five-volt source across a resistor 37 and is connected to ground across a capacitor 39. A fifth input terminal of the one-shot module 41 is grounded. The one-shot module 41 produces and issues a time-out output signal of length approximately 150 μsec that is received at the cathode of a diode 43, and the resulting signal produced at the anode of the diode passes through a resistor 45 and is received at the negative input terminal of a first operational amplifier ("op amp") 47. The negative input terminal of the op amp 47 is connected to the output terminal thereof across a feedback resistor 49 and is connected across a voltage pull-up resistor 51 to a five-volt source. The positive input terminal of the op amp 47 is connected to a five-volt source.

The output signal from the op amp 47 is received by a negative input terminal of a second op amp 55 across a resistor 53, and this input terminal is connected to the output terminal of the op amp 55 across a resistor 57. The positive input terminal of the op amp 55 is connected to a five-volt source across a resistor 57. The output signal from the op amp 55 is received by a diode temperature control circuit (optional) that is not shown and is not part of the invention. The portion of the circuit including the resistors 53 and 57 and the op amp 55 is optional.

The negative input terminal of the op amp 69 controlling the laser diode is connected to the output terminal of the op amp 47 across the resistor 59, which carries a suppression signal. The negative input terminal of the op amp 69 is connected across a resistor 61 to a potentiometer 63 and across a resistor 65 to a four volt power supply. This power supply is connected across a current-sensing resistor 67 to the op amp positive input terminal and to the collector of an MOS transistor 71. The circuit consisting of the resistors 61, 65 and 67, the potentiometer 63, the op amp 69 and the four volt power supply serves to control the current dilevered to the anode of a laser diode 73, whose cathode is grounded. The positive input terminal and the output terminal of the op amp 69 are connected to the collector and gate, respectively, of the MOS transistor 71, whose source is connected to the nanode of the laser diode 73. Receipt by the anode of the laser diode 73 of a non-zero current produces a light wave 75 that serves as an optical or light pump wave for the laser 17 shown in FIG. 1.

In a preferred embodiment, the resistors 33, 35, 37, 45, 49, 51, 53, 57, 59, 61, 65 and 67 have the resistance values 1 kilo-ohm ("1K"), 1K, 43.2K, 2.21K, 10K, 3.01K, 68K, 15K, 470K, 30K, 1K and 0.2K, respectively. In this preferred embodiment, the capacitor 39 has capacitance value 0.01 μF, the potentiometer 63 has a maximum resistance value of 2 kilo-ohms, the one-shot module is a 74LS123 or equivalent chip, the op amps 47, 55 and 69 are all LM 324 or equivalent amplifiers, and the MOS transistor 71 is a model IRF 530 or equivalent transistor.

The circuit embodiment shown in FIG. 3 drives current that powers a laser diode. When a trigger signal is supplied by the user into the trigger input J1 the circuit adjusts the laser diode current between user-set levels. Full current is delivered to the laser diode for 150 μsec after each trigger signal, at which time the current is reduced to about 65 percent of its full value, unless another trigger signal is received before this time. The user sets the full operating level of the laser diode current using potentiometer 63. In this embodiment, the circuit typically drives the laser diode at approximately 400 mA. The current is regulated by the transistor 71, the op amp 69, and associated resistors including the potentiometer 63. For applied trigger repetition rates above 6.67 kHz, the output of the one-shot timing circuit 41 remains in the high state (near 5 V) at all times, and the output of operational amplifier 47 is 5 Volts.

This keeps the output of the op amp 69 and the transistor 71 high.

For repetition rates lower than 6.67 kHz, the output of the one-shot circuit 41 is reduced to about 0.2 V after each time-out of duration $t_r$. This causes a change in the operating point of the op amp 47 so that the output voltage of this op amp then increases to a higher voltage of about 16 V. The resulting current through the resistor 59 is about 25 $\mu$A, and this current causes a reduction in the voltage output of the op amp 69 and a consequent drop in the laser diode current drive to about 65 percent of its value before the time $t_r$. Note that the change in output voltage of the op amp 47 affects the op amp 55 as well. The output of the op amp 55 connects to the laser diode temperature control to provide offsetting average temperature compensation, all optional. At reduced operating current, the heat dissipation and thermal gradient in the laser diode are reduced. An optional circuit, not shown and not a part of the invention, may then compensate by raising the laser diode heat sink temperature, or by reducing the system cooling.

The circuit 80 shown in FIG. 4 performs the same function as the circuit 30 in FIG. 3, except that diode output power is controlled, rather than diode input current. A beamsplitter 81 samples the optical power in the pump beam path, diverting a small percentage, typically, less than 1 percent, of pump light to a photomonitor diode 83. A second potentiometer 85 is adjusted to provide 5 Volts at the input and output terminals of the amplifier 47 when the input trigger repetition rate exceeds 6.67 kHz. This is the standard operating point for 100 percent pump power. Variations in laser diode optical power are suppressed by the closed loop monitor feedback circuit. In this embodiment, the circuit parameters are the same as in FIG. 4, except that resistors 53 and 59 preferably have the resistance values 30K and 301K, respectively. The photomonitor diode 83 is set to 5 Volts at rated power.

For repetition rates lower than 6.67 kHz, after the refresh time $t=t_r$, the voltage to which the photomonitor voltage is compared by the amplifier 47 is lowered to approximately 2.5 V from 5 V by the low output from the one-shot module 41. The op amp 47 responds to this voltage drop by increasing its output, thereby reducing the laser diode current and laser diode power until a new equilibrium point is established at approximately 50 percent power output, or until a new trigger signal TS is received on the trigger input signal line 15.

An alternative embodiment 90 of the monitoring means for the laser diode is shown in FIG. 5. Here the light from the laser diode does not directly reach the photodiode. A laser diode 91 emits light 93 that is sampled by a beamsplitter 95, and the main beam 97 is sent to the laser head 111. However, the sampled light beam 99 produced by the beam splitter 95 is not sent directly to a detector, as in FIG. 4. The sampled light 99 is received by a thin plate 101 of laser material of the same composition as the laser gain material employed in the laser head 17 in FIG. 1. A second beamsplitter 107 is optionally included in the sampled beam path and is discussed below.

The thickness of the thin plate 101 of laser material is chosen to be approximately equal to the depth in the active laser material 113 over which the pump beam 97 spatially overlaps the laser mode 115 in the laser head 111. This overlap depth can be limited by choice of any of four control parameters: (1) thickness of the active laser material; (2) distance over which the laser beam and the optical pump beam coincide; (3) distance over which the pump focuses predominantly within the laser mode; and (4) pump absorption depth within the laser material.

The thin plate 101 of laser material emits fluorescence from an upper laser level in proportion to the pump light absorbed. A light filter 103 (optional) absorbs any laser diode pump light transmitted by the thin plate 101 and allows only fluorescence radiation to reach a detector 105. Additional imaging optics may be inserted between the laser material 101 and the detector 105, to improve detection efficiency or to selectively sample particular regions of the excited laser material. The detector 105 may be positioned at any angle $\phi$ relative to the direction of incident light 100. It is preferable to position the detector 105 to receive fluorescence radiation at the side ($\phi > 0°$) of the laser material 101, in order to reduce the filtering of incident light required at the detector. Alternatively, the angle $\phi$ may be approximately 0°, with filtering of incident light wavelengths being provided at the detector 105 by the filter 103.

Filter material for eliminating 0.8 $\mu$m wavelength pump light at the filter 103 can be commercially obtained from Schott Glass Company or Hoya Glass Company. Monitoring the fluorescence, rather than the laser diode laser light directly, has the advantage of measuring the effective power transfer to the laser material from the laser diode. If the laser diode wavelength shifts so the diode output light is slightly less efficiently absorbed, the laser diode power may be unaltered, and the photomonitor 83 in FIG. 4, will detect no difference. However, with the arrangement 90 shown in FIG. 5, the photodetector 105 will detect a reduced effective pumping power if the wavelength shifts slightly away from the absorption maximum of the gain material, and the laser diode current will be adjusted to boost the power to compensate for the reduced pump power absorbed.

The technique illustrated in FIG. 3 is the most simple and is often the preferable approach. An advantage of the monitoring technique illustrated in FIG. 4 is that it allows control of laser diode output variations with a high bandwidth. An advantage of using the fluorescence monitoring technique shown in FIG. 5, is that this technique controls the effects of laser diode spectral and power shifts. However, this technique is more complex than the techniques illustrated in FIGS. 3 and 4, and the circuit must be compensated to account for time delay in the fluorescence from the laser material in the thin plate 101. The embodiment illustrated in FIG. 5 is preferable for long-term, low bandwidth control.

A variation of the fluorescence monitoring embodiment, sampling the laser diode light directly with additional detection means, is also illustrated in FIG. 5. A second beamsplitter 107 and an associated detector 109 sample the laser diode light directly. With simultaneous detection by the fluorescence detector 105 and by the direct detector 109, changes in diode wavelength near the absorption peak of the laser material can be distinguished from changes in laser diode output power. This allows a user to adjust both the laser diode output power and wavelength. This wavelength is controlled primarily by the laser diode temperature, and laser power is controlled primarily by the laser diode current. A computer, an analog control circuit, or a microprocessor-based control system can also replace the user in this control system.

In an alternative embodiment 120 of the circuit illustrated in FIG. 6, useful for the fluorescence monitoring embodiment of FIG. 5, a block of fluorescent material 121 receives a sample of the pump light reflected by the beam splitter 81. A portion of the fluorescent radiation thus produced is filtered and received by a photodiode or other detector 123. The voltage produced at the anode of the photodiode 123 is directed to the op amp 47 through a resistor 129 and through a parallel differentiator circuit that includes a capacitor 125 and a resistor 127. This differentiator circuit preferably has a time constant in the range of 0.1–1 $\mu$sec, which corresponds to the laser material fluorescence decay lifetime and is set by the choice of capacitance value and resistance values in this circuit. The output signal from this differentiator circuit is received by the positive input terminal of the op amp 47. The op amp 47 has a negative feedback path consisting of the resistor 49 and a capacitor 131 in parallel. Insertion of the capacitor 131 slows the response of the op amp 47 in order to suppress current spikes that might appear at the diode when the output signal from the one-shot device 41 goes high. Energy storage in the fluorescent material block 121 effectively integrates the laser diode output signal, and insertion of the differentiator circuit and feedback capacitor 131 allows compensation for the integration effect.

The embodiments illustrated in FIGS. 1–6 may control a Q-switched solid-state laser, such as ruby, Nd:YAG, Nd:YLF, Nd:YVO$_4$ or other rare earth-doped lasers. Alternatively, the invention disclosed here may be used to control pumping of a Q-switched gas laser, such as CO$_2$, CO, iodine or others. Where the fluorescence monitoring technique is used for a gaseous laser material, it may be preferable to provide a high pressure volume of the gas for fluorescence monitoring in order to produce a fluorescence radiation signal of reasonable intensity.

Where certain four-level laser materials, such as CO$_2$, are used, the presence of mediating transitions from the top energy level to the upper laser level, and from the lower laser level to the ground or quasi-ground level, may require that the input current or input power be provided differently than is illustrated in FIG. 1. More particularly, the input current I(t) may have to: (1) begin at a first constant current value $I_s$ for a first time interval given by $0<t<t_r$; (2) drop to a second constant current value $I_r$ for a second time interval given by $t_r<t<t_q$; and (3) increase or otherwise vary slowly with time for $t<t_q$ in a predetermined manner in order to compensate for presence of "bottlenecking" at the last downward transition in the sequence. Bottlenecking will occur if the decay time constant $T_{34}$ for transition from the lower laser level to the ground or quasi-ground level is much longer than both of the decay time constants $T_{12}$ and $T_{23}$ from the top level to the upper laser level and from the upper laser level to the lower laser level, respectively. In such instance, the reduced current value $I_r$ would have to be steadily increased, within a single Q-switching time interval, as illustrated qualitatively in FIG. 7, to compensate for the progressive deterioration in population inversion that occurs because of the bottleneck in the 3→4 transition. Non-constancy of the reduced current value $I_r(t)$ might also be required for other situations that require compensation for some effect that develops over a time interval that is shorter than the time interval between Q-switched pulses. This could occur for relatively low repetition rate Q-switching of a laser.

Another example of such an effect is reproducible shifts in the diode temperature due to changes in the diode current. This shift will cause a slight change in time variation in the pumping efficiency.

Different lasers require different embodiments for the control technique disclosed here. Each circuit is particular to the type of pump system used and the electronic system into which it integrates. Designing a specialized circuit that can reduce current for particular lasers is a standard problem for a skilled electrical designer. Another extension of the invention varies the timing delay or refresh time $t_r$, the pump current levels, and the percent current reduction to tailor laser performance to particular applications.

An alternative embodiment to an implementation of the technique of delayed current reduction disclosed here utilizes a microprocessor-controlled power supply. When the system is turned on, certain operating characteristics, such as the pulse energy at several specified repetition rates, are measured by the microprocessor. An energy meter within the laser provides feedback information on the laser's performance to the microprocessor. A search algorithm then empirically optimizes the parameters $t_r$ and $I_r/I_s$ to produce a closest match to the desired high and low repetition rate operating parameters.

We claim:

1. A method for control of a Q-switched laser that allows variation in the pulse repetition rate of the laser, the method comprising the steps of:
   (1) providing a current-driven laser pump source, positioned to pump the laser;
   (2) providing a current drive for the pump source of a first predetermined current value $I_s$ for a time interval given by $t_0 \leq t < t_0 + t_r$, where $t_r$ is a predetermined time value and $t_0$ is an arbitrary initial time;
   (3) providing a Q-switch connected to the laser to allow laser pulses to issue from the laser at selected times by issuance of Q-switch trigger signals at these selected times;
   (4) if a Q-switch trigger signal is received by the laser at an elapsed time $\Delta t < t_r$ after the laser received a preceding Q-switch trigger signal, allowing the laser to emit a laser pulse that extracts energy stored in the laser;
   (5) if the laser has not received a Q-switch trigger signal at the elapsed time $\Delta t = t_r$, reducing the current drive for the pump source to a second predetermined value $I_r < I_s$ when the elapsed time reaches $\Delta t = t_r$, where the current value $I_r$ is sufficient to maintain the energy stored in the laser at a predetermined level, and allowing the laser to emit a laser pulse if the laser next receives a Q-switch trigger signal at an elapsed time $\Delta t < t_r$; and
   (6) repeating steps (2)–(5) at least once for a subsequent laser pulse.

2. The method of claim 1, further comprising the step of choosing said laser material from the class of solid-state materials consisting of ruby, Nd:YAG, Nd:YLF and Nd:YVO$_4$.

3. The method of claim 1, further comprising the step of choosing said laser material from the class of gaseous materials consisting of CO$_2$ and CO.

4. A method for control of a Q-switched laser that allows variation in the pulse repetition rate of the laser, the method comprising the steps of:

(1) providing a laser pump source, positioned to pump the laser by providing a power input signal for the laser;

(2) providing a pump source drive for the pump source with a first predetermined input signal power $P_s$ for a time interval given by $t_0 \leq t < t_0 + t_r$, where $t_r$ is a predetermined time value and $t_0$ is an arbitrary initial time;

(3) providing a Q-switch connected to the laser to allow laser pulses to issue from the laser at selected times by issuance of Q-switch trigger signals at these selected times;

(4) if a Q-switch trigger signal is received by the laser at an elapsed time $\Delta t < t_r$ after the laser received a preceding Q-switch trigger signal, allowing the laser to emit a laser pulse that extracts energy stored in the laser;

(5) if the laser has not received a Q-switch trigger signal at the elapsed time $\Delta t = t_r$, reducing the drive for the pump source to a second predetermined input signal power value $P_r < P_s$ when the elapsed time reaches $\Delta t = t_r$, where the power value $P_r$ is sufficient to maintain the energy stored in the laser at a predetermined level, and allowing the laser to emit a laser pulse if the laser next receives a Q-switch trigger signal at an elapsed time $\Delta t > t_r$; and (6) repeating steps (2)–(5) at least once for a subsequent laser pulse.

5. The method of claim 4, further comprising the step of choosing said laser material from the class of solid-state materials consisting of ruby, Nd:YAG, Nd:YLF and Nd:YVO$_4$.

6. The method of claim 4, further comprising the step of choosing said laser material from the class of gaseous materials consisting of $CO_2$ and CO.

7. A method for control of a Q-switched laser that allows variation in the pulse repetition rate of the laser, the method comprising the steps of:

(1) providing a laser pump source, positioned to pump the laser by providing a power input signal for the laser;

(2) providing a pump source drive for the pump source with a first predetermined input signal power $P_s$ for a time interval given by $t_0 / s t < t_0 + t_r$ where $t_r$ is a predetermined time value and $t_0$ is an arbitrary initial time;

(3) providing a Q-switch connected to the laser to allow laser pulses to issue from the laser at selected times by issuance of Q-switch trigger signals at these selected times;

(4) providing a separate volume of the laser material that receives a small predetermined portion of the optical power from the pump source, where the thickness of this separate volume is approximately equal to the thickness of the laser material in the Q-switched laser that is pumped by the pump source, and determining the fluorescence intensity emitted by this separate volume;

(5) if a Q-switch trigger signal is received by the laser at an elapsed time $\Delta t < t_r$ after the laser received a preceding Q-switch trigger signal, allowing the laser to emit a laser pulse that extracts energy stored in the laser;

(6) if the laser has not received a Q-switch trigger signal at the elapsed time $\Delta t = t_r$, reducing the drive for the pump source to a second determinable input signal power $P_r < P_s$ when the elapsed time reaches $\Delta t = t_r$, where the power value $P_r$ is sufficient to maintain the fluorescence intensity emitted by the block at a predetermined intensity, and allowing the laser to emit a laser pulse if the laser next receives a Q-switch trigger signal at an elapsed time $\Delta t > t_r$; and (7) repeating steps (2)–(6) at least once for a subsequent laser pulse.

8. The method of claim 7, further comprising the steps of:

providing a pump power monitor to receive a second small predetermined portion of said optical power received by said laser from said pump power source and to determine the optical power being received by said laser; and adjusting said power value $P_r$ according to said fluorescence intensity emitted by said laser material and according to said optical power received by said laser.

9. The method of claim 7, further comprising the step of choosing said laser material from the class of solid-state materials consisting of ruby, Nd:YAG, Nd:YLF and Nd:YVO$_4$.

10. The method of claim 7, further comprising the step of choosing said laser material from the class of gaseous materials consisting of $CO_2$ and CO.

11. A method for control of a Q-switched laser that allows variation in the pulse repetition rate of the laser, the method comprising the steps of:

(1) providing a current-driven laser pump source, positioned to pump the laser;

(2) providing a current drive for the pump source of a first predetermined current value $I_s$ for a time interval given by $t_0 \leq t < t_0 + t_r$, where $t_r$ is a predetermined time value and $t_0$ is an arbitrary initial time;

(3) providing a Q-switch connected to the laser to allow laser pulses to issue from the laser at selected times by issuance of Q-switch trigger signals at these selected times;

(4) if a Q-switch trigger signal is received by the laser at an elapsed time $\Delta t < t_r$ after the laser received a preceding Q-switch trigger signal, allowing the laser to emit a laser pulse that extracts energy stored in the laser;

(5) if the laser has not received a Q-switch trigger signal at the elapsed time $\Delta t = t_r$, reducing the current drive for the pump source to a second current value $I_r(t) < I_s$ that varies with time in a predetermined manner when the elapsed time reaches $\Delta t = t_r$, where the current value $I_r$ is sufficient to maintain the energy stored in the laser at a predetermined level, and allowing the laser to emit a laser pulse if the laser next receives a Q-switch trigger signal at an elapsed time $\Delta t > t_r$; and (6) repeating steps (2)–(5) at least once for a subsequent laser pulse.

12. The method of claim 11, further comprising the step of causing said current value $I_r(t)$ to increase monotonically for all times $t > t_r$.

13. A method for control of a Q-switched laser that allows variation in the pulse repetition rate of the laser, the method comprising the steps of:

(1) providing a laser pump source, positioned to pump the laser;

(2) providing a pump source drive for the pump source of a first predetermined input signal power $P_s$ for a time interval given by $t_0 \leq t < t_0 + t_r$, where $t_r$ is a predetermined time value and $t_0$ is an arbitrary initial time;

(3) providing a Q-switch connected to the laser to allow laser pulses to issue from the laser at selected times by issuance of Q-switch trigger signals at these selected times;

(4) if a Q-switch trigger signal is received by the laser at an elapsed time $\Delta t < t_r$ after the laser received a preceding Q-switch trigger signal, allowing the laser to emit a laser pulse that extracts energy stored in the laser;

(5) if the laser has not received a Q-switch trigger signal at the elapsed time $\Delta t = t_r$, reducing the drive for the pump source to a second input power value $P_r(t) < P_s$ that varies with time in a predetermined manner when the elapsed time reaches $\Delta t = t_r$, where the input power value $P_r(t)$ is sufficient to maintain the energy stored in the laser at a predetermined level, and allowing the laser to emit a laser pulse if the laser next receives a Q-switch trigger signal at an elapsed time $\Delta t > t_r$; and (6) repeating steps (2)–(5) at least once for a subsequent laser pulse.

14. The method of claim 11, further comprising the step of causing said input power value $P_r(t)$ to increase monotonically for all times $t > t_r$.

15. A method of controlling the amplitude of a laser pump signal, used to pump a laser, so that the energy or power that can be extracted from the laser does not exceed a predetermined level, the method comprising the steps of:

(1) providing a laser pump source, positioned to pump the laser by providing a power input signal for the laser;

(2) providing a pump source drive for the laser pump source;

(3) providing a separate volume of the laser material that receives a small predetermined portion of the optical power received by the laser from the pump source, where the thickness of this separate volume is approximately equal to the thickness of the laser material in the Q-switched laser that is pumped by the pump source, and determining the fluorescence intensity emitted by this separate volume; and (4) controlling the pump source drive to vary the pump power delivered by the pump source to the laser so that the fluorescence intensity emitted by the separate volume does not exceed a predetermined intensity value.

16. The method of claim 15, further comprising the steps of:

providing a pump power monitor to receive a second small predetermined portion of said optical power received by said laser from said pump source and to determine the optical power being received by said laser; and adjusting said energy delivered by said pump source to said laser according to said fluorescence intensity emitted by said separate volume of laser material and according to said optical power received by said laser.

17. Apparatus for control of a Q-switched laser that allows variation in the pulse repetition rate of the laser, the apparatus comprising:

a current-driven laser pump source, positioned to pump the laser;

a controllable current drive, connected to the pump source, that provides a first predetermined current value $I_s$ for a time interval given by $t_0 \leq t \leq t_0 + t_r$, where $t_r$ is a predetermined time value and $t_0$ is an arbitrary initial time at which the current drive is activated, and that provides a second predetermined current value $I_r < I_s$ for a time interval given by $t > t_r + t_0$, where the current value $I_r$ is sufficient to maintain the energy stored in the pumped laser at a predetermined level; and a Q-switch connected to the laser to cause laser pulses to issue at selected times by issuance of Q-switch trigger signals from the Q-switch to the laser at these selected times.

18. Apparatus for control of a Q-switched laser that allows variation in the pulse repetition rate of the laser, the apparatus comprising:

a laser pump source, positioned to pump the laser;

a controllable power input drive, connected to the pump source, that provides a first predetermined input signal power $P_s$ for a time interval given by $t_0 \leq t \leq t_0 + t_r$, where $t_r$ is a predetermined time value and $t_0$ is an arbitrary initial time at which the current drive is activated, and that provides a second predetermined input signal power $P_r < P_s$ for a time interval given by $t > t_r + t_0$, where the input signal power $P_r$ is sufficient to maintain the energy stored in the pumped laser at a predetermined level; and a Q-switch connected to the laser to cause laser pulses to issue at selected times by issuance of Q-switch trigger signals from the Q-switch to the laser at these selected times.

* * * * *